(12) United States Patent
Kim et al.

(10) Patent No.: US 10,879,338 B2
(45) Date of Patent: Dec. 29, 2020

(54) DISPLAY DEVICE HAVING A TRENCH PORTION

(71) Applicant: SAMSUNG DISPLAY CO., LTD., Yongin-si (KR)

(72) Inventors: Kiwook Kim, Yongin-si (KR); Kwangmin Kim, Yongin-si (KR); Jisu Na, Yongin-si (KR); Minwoo Byun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/364,732

(22) Filed: Mar. 26, 2019

(65) Prior Publication Data

US 2020/0027943 A1 Jan. 23, 2020

(30) Foreign Application Priority Data

Jul. 17, 2018 (KR) ........................ 10-2018-0083128

(51) Int. Cl.
*H01L 27/32* (2006.01)
*H01L 51/00* (2006.01)
*H01L 51/52* (2006.01)

(52) U.S. Cl.
CPC ...... *H01L 27/3276* (2013.01); *H01L 27/3279* (2013.01); *H01L 51/0096* (2013.01); *H01L 51/5253* (2013.01); *H01L 51/5246* (2013.01)

(58) Field of Classification Search
CPC .......... H01L 27/3276; H01L 27/10897; H01L 2924/181; H01L 2224/11; H01L 2224/05552
See application file for complete search history.

(56) References Cited

U.S. PATENT DOCUMENTS

| | | | |
|---|---|---|---|
| 2007/0024181 A1* | 2/2007 | Oh | ..................... H01L 27/3258 313/500 |
| 2016/0019856 A1 | 1/2016 | Tanaka et al. | |
| 2016/0126300 A1* | 5/2016 | Su | ..................... H01L 27/3276 257/40 |
| 2017/0338295 A1 | 11/2017 | Lee et al. | |
| 2018/0026152 A1 | 1/2018 | Benson et al. | |

FOREIGN PATENT DOCUMENTS

| | | |
|---|---|---|
| KR | 10-2017-0130016 | 11/2017 |
| KR | 10-2017-0137230 | 12/2017 |

* cited by examiner

*Primary Examiner* — Caridad Everhart
(74) *Attorney, Agent, or Firm* — F. Chau & Associates, LLC

(57) ABSTRACT

A display device includes a substrate including a trench portion. The substrate includes a display area and a peripheral area adjacent to the display area. The display area includes a first display area and a second display area arranged with the trench portion therebetween to display an image. A thin-film transistor and a display element are each arranged in the display area. A built-in circuit portion is over the peripheral area and is adjacent to the trench portion. A first wiring is in the first display area and a second wiring is in the second display area. A connecting wiring connects the first wiring to the second wiring and overlaps the built-in circuit portion.

20 Claims, 11 Drawing Sheets

DISPLAY DEVICE HAVING A TRENCH PORTION

CROSS-REFERENCE TO RELATED APPLICATION

This application claims priority under 35 U.S.C. § 119 to Korean Patent Application No. 10-2018-0083128, filed on Jul. 17, 2018, in the Korean Intellectual Property Office, the disclosure of which is incorporated by reference herein in its entirety.

1. TECHNICAL FIELD

Exemplary embodiments of the present invention relate to a display device, and more particularly, to a display device having a trench portion.

2. DISCUSSION OF RELATED ART

A display device may be a device for visually displaying data. Such a display device may include a substrate partitioned into a display area and a peripheral area. The display area may include scan lines and data lines that are insulated from each other, and the scan lines and the data lines may intersect to define a plurality of pixel areas in the display area. Furthermore, the display area may include a thin-film transistor corresponding to each of the pixel areas, and a pixel electrode electrically connected to the thin-film transistor. Also, the display area may include an opposite electrode commonly provided in the pixel areas. The peripheral area may include various wiring for transmitting an electrical signal to the display area, a scan driver, a data driver, and a controller.

The usage of such display devices has expanded. In addition, such display devices have become thinner and lighter, and their range of use is widening. Thus, the shape of such display devices, including the shape of display areas providing images, are becoming more diverse.

SUMMARY

An exemplary embodiment of the present invention provides a display device capable of realizing relatively high-quality images.

According to an exemplary embodiment of the present invention, a display device includes: a substrate having a trench portion which is recessed into the substrate at a first side, the substrate including a display area and a peripheral area around the display area, wherein the display area includes a first display area and a second display area arranged with the trench portion therebetween to display an image; a thin-film transistor and a display element, each arranged in the display area; a built-in circuit portion over the peripheral area and arranged adjacent to the trench portion; a first wiring in the first display area and a second wiring in the second display area; and a connecting wiring connecting the first wiring to the second wiring and overlapping the built-in circuit portion.

The built-in circuit portion may include a plurality of stages including at least one peripheral thin-film transistor, and the connecting wiring may overlap the at least one peripheral thin-film transistor.

The display device may further include: a scan line connected to the built-in circuit portion and overlapping the display area, wherein the scan line may intersect the connecting wiring in a layer different from that of the connecting wiring.

The connecting wiring may include a first connecting wiring and a second connecting wiring adjacent to each other, and a shortest distance between the first connecting wiring and the second connecting wiring in a region not overlapping the built-in circuit portion may be greater than a shortest distance between the first connecting wiring and the second connecting wiring in a region overlapping the built-in circuit portion.

The connecting wiring may include a first connecting wiring and a second connecting wiring adjacent to each other, and the first connecting wiring and the second connecting wiring in a region overlapping the built-in circuit portion may be curved.

A degree of the curvature of the first connecting wiring and a degree of the curvature of the second connecting wiring in the region overlapping the built-in circuit portion may be different from each other.

The substrate may include a first side on which the trench portion is located and a second side that intersects the first side and is longer than the first side, and a pad portion which is adjacent to the second side in the peripheral area and may transmit a control signal to the first wiring.

The display device may further include: an inorganic protective layer covering the first wiring and the second wiring, and a planarization layer on the inorganic protective layer, wherein the connecting wiring is located over the planarization layer and connected to the first wiring and the second wiring through a first contact hole and a second contact hole penetrating the planarization layer and the inorganic protective layer, respectively.

The display device may further include: a first power supply voltage line arranged to correspond to one side of the display area; and a second power supply voltage line surrounding at least a portion of the display area, wherein the built-in circuit portion may be located between the display area and the second power supply voltage line.

The second power supply voltage line may be provided by stacking a first layer and a second layer, the first layer provided in the same layer as that of the first wiring and the second layer including the same material as that of the connecting wiring.

The display device may include a pixel electrode, an intermediate layer, and an opposite electrode, a conductive layer may be located over the second power supply voltage line, the conductive layer including the same material as that of the pixel electrode, and the opposite electrode may extend to the peripheral area and may be electrically connected to the second power supply voltage line via the conductive layer.

The display device may further include: a lower conductive layer overlapping the thin-film transistor with an insulating layer therebetween, the lower conductive layer being located between the substrate and the thin-film transistor, wherein the connecting wiring may be on the same layer as that of the lower conductive layer.

The connecting wiring may be connected to the first wiring through a contact hole penetrating the insulating layer.

The display device may further include: a thin-film encapsulation layer sealing the display area and including at least one inorganic encapsulation layer and at least one organic encapsulation layer; and a dam portion in the peripheral area and protruding from the substrate.

The display device may further include: a sealing substrate sealing the display area and facing the substrate; and a sealing member surrounding the peripheral area and joining the substrate to the sealing substrate.

According to an exemplary embodiment of the present invention, a display device includes: a substrate having a trench portion which is recessed into the substrate at a first side, the substrate including a display area and a peripheral area around the display area, wherein the display area includes a first display area and a second display area arranged with the trench portion therebetween to display an image; a thin-film transistor and a display element, each arranged in the display area; a first built-in circuit portion over the peripheral area and adjacent to the trench portion, the first built-in circuit portion including at least one peripheral thin-film transistor; a pad portion over a second side intersecting the first side, wherein a controller is mounted on the pad portion; a first wiring in the first display area and a second wiring in the second display area; and a connecting wiring connecting the first wiring to the second wiring and overlapping the built-in circuit portion.

The second side may be longer than the first side.

The display device may further include: a second built-in circuit portion adjacent to a third side at a side opposite to that of the first side of the substrate.

The connecting wiring may overlap the at least one peripheral thin-film transistor.

At least a portion of the connecting wiring may be curved along a shape of the trench portion.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
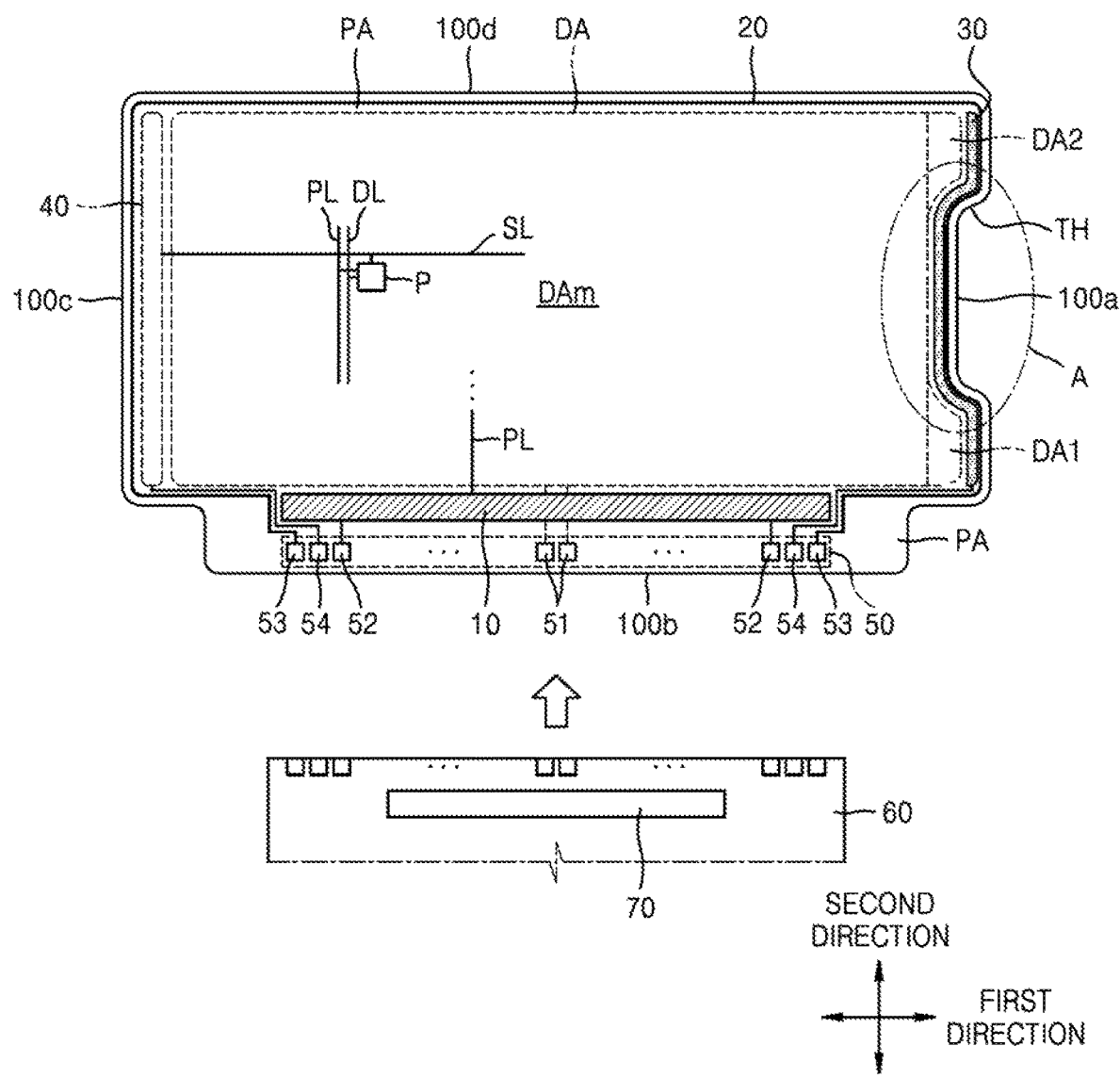
FIG. 1 is a plan view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first", "second", etc. may be used herein to describe various components, these components should not be limited by these terms.

An expression used in the singular encompasses the expression of the plural, unless it has a clearly different meaning in the context.

It will be understood that when a component, such as a layer, a film, a region, or a plate, is referred to as being "on" another component, the component may be directly on the other component or intervening components may be present.

Sizes of components in the drawings may be exaggerated for clarity of description.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

Furthermore, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another. For example, the X-axis may be perpendicular to the Y-axis. The X-axis and the Y-axis may define a plane along which a substrate extends. A Z-axis may be perpendicular to the first and second axes X and Y. Thus, the Z-axis may be orthogonal to a plane extending in the X and Y axes. A thickness described herein may refer to a thickness along the Z-axis direction.

Display devices may be used to display images, texts, etc. and can be classified into liquid crystal displays, electrophoretic displays, organic light-emitting displays, inorganic light-emitting displays, field emission displays, surface-conduction electron-emitter displays, plasma displays, and cathode ray displays.

As' an example herein, a first direction may be perpendicular to a second direction. The first direction and the second direction may define a plane along which a display panel extends. A third direction may be perpendicular to the first and second directions. Thus, the third direction may be orthogonal to a plane extending in the first and second directions.

An organic light-emitting display will be described as a display device according to an exemplary embodiment of the present invention, but a display device of the present invention is not limited thereto and various kinds of display devices may be used.

FIG. 1 is a plan view of a display device according to an exemplary embodiment of the present invention.

Referring to FIG. 1, a substrate 100 of the display device may include a trench portion TH. The trench portion TH may be recessed into the substrate 100 at a first side 100a. The trench portion TH may penetrate through an upper surface and a lower surface of the substrate 100. The trench portion TH may be provided in a U-shape or a shape in which a portion of a polygon is removed. However, exemplary embodiments of the present invention are not limited thereto, and various other shapes of the trench portion TH may be employed, as desired. The trench portion TH may include a module in which a camera, a speaker, or a sensor are arranged.

The substrate 110 may include a display area DA and a peripheral area PA adjacent to the display area DA. As an example, the peripheral area PA may be arranged at four sides of the display region DA in a plan view (e.g., along the third direction); however, exemplary embodiments of the present invention are not limited thereto. For example, the peripheral area PA may be arranged at less than four sides (e.g., three sides) of the display region DA in a plan view. The display area DA may include a main area DAm, a first display area DA1, and a second display area DA2. The first display area DA1 and the second display area DA2 may protrude from the main area DAm in a first direction and the first display area DA1 and the second display area DA2 may be spaced apart from each other by a predetermined distance in a second direction. As an example, the first display area DA1 and the second display area DA2 may be arranged at a first side and a second side of the display area DA, respectively, with the trench portion TH formed therebetween (e.g., evenly spaced at a central region between the first display area DA1 and the second display area DA2). The peripheral area PA may be adjacent to an outer edge of the display area DA.

The substrate 100 may include the first side 100a provided with the trench portion TH, a second side 100b in a direction intersecting the first side 100a, a third side 100c on the opposite side of the display area DA from the first side 100a, and a fourth side 100d on the opposite side of the display area DA from the second side 100b. Lengths of the first side 100a and the third side 100c of the substrate 100 may be shorter than lengths of the second side 100b and the fourth side 100d.

The display area DA may include a scan line SL extending in the first direction and pixels P connected to a data line DL extending in the second direction intersecting the first direction, Each pixel P may also be connected to a driving voltage line PL extending in the second direction. In this specification, the term "extension of a wiring in the first direction or the second direction" may refer to not only linear extension but also zigzag or curved extension along the first direction or the second direction.

Each pixel P may emit light of, for example, red, green, blue, or white, and may include, for example, an organic light-emitting diode. Each pixel P may further include elements such as a thin-film transistor (TFT), or a storage capacitor. The display area DA may provide a predetermined image through light emitted from the pixels P. The pixel P in this specification may refer to a sub-pixel which emits light of any one of red, green, blue or white as described above. The pixels P may be arranged in various forms such as a stripe structure, or a PENTILE structure.

The peripheral area PA may be an area in which the pixels P are not arranged, and that does not provide an image. The peripheral area PA may include a first power supply voltage line 10 and a second power supply voltage line 20 to which different power supply voltages are applied. The peripheral area PA may further include a first built-in circuit portion 30, a second built-in circuit portion 40, and a pad portion 50.

The first power supply voltage line 10 may be arranged to correspond to a side of the display area DA in the peripheral area PA. A plurality of driving voltage lines PL for transmitting driving voltages to the plurality of pixels P in the display area DA may be connected to the first power supply voltage line 10. The first power supply voltage line 10 may be connected to a first terminal 52 of the pad portion 50.

The second power supply voltage line 20 may be arranged to partially surround the display area DA in the peripheral area PA (e.g., when viewed in a plan view in the third direction). The second power supply voltage line 20 adjacent to the trench portion TH may be curved along a shape of the trench portion TH. The second power supply voltage line 20 may extend along the remaining sides except for any one side of the display area DA adjacent to the first power supply voltage line 10. The second power supply voltage line 20 may be connected to a second terminal 53 of the pad portion 50.

The first built-in circuit portion 30 may be arranged adjacent to the first side 100a of the substrate 100, for example, the trench portion TH, and may be between the display area DA and the second power supply voltage line 20. The first built-in circuit portion 30 may be curved along the shape of the trench portion TH. Alternatively, the first built-in circuit portion 30 may be curved along a shape of the display area DA. As an example, the first built-in circuit portion 30 may be curved along shapes of the first display area DA1 and the second display area DA2 protruding in the first direction, and a shape in which one corner of the display area DA is rounded.

The first built-in circuit portion 30 may include a scan driver. As an example, the first built-in circuit portion 30 may generate a scan signal to be provided to the pixels P of the display area DA.

The second built-in circuit portion 40 may be adjacent to the third side 100c of the substrate 100. The second built-in circuit portion 40 may include a scan driver. As an example, the second built-in circuit portion 40 may generate a scan signal to be provided to the pixels P of the display area DA.

The first built-in circuit portion 30 and the second built-in circuit portion 40 may be on opposite sides of the display area DA and may perform dual scanning. For example, the first built-in circuit portion 30 may generate a scan signal and transmit the scan signal to some of the pixels P included in the display area DA, and the second built-in circuit portion 40 including the scan driver may generate a scan signal and transmit the scan signal to the remaining of the pixels P included in the display area DA. The first built-in circuit portion 30 and the second built-in circuit portion 40 may be synchronized by a synchronized clock signal.

Each of the first built-in circuit portion 30 and the second built-in circuit portion 40 may further include a light-emitting driver. The light-emitting driver may generate an emission control signal. In an exemplary embodiment of the present invention, the first built-in circuit portion 30 may be configured as a scan driver, and the second built-in circuit portion may be formed as a light-emitting driver. The second built-in circuit portion 40 may be omitted. The first built-in circuit portion 30 and/or the second built-in circuit portion 40 may be connected to a third terminal 54 of the pad portion 50.

The pad portion 50 may be adjacent to the second side 100b or the fourth side 100d, which are long sides of the substrate 100. Thus, although the pad portion 50 is illustrated as being on the second side 100b, the pad portion 50 may be on the fourth side 100d.

The pad portion 50 may include a plurality of terminals 51, 52, 53, and 54. The pad portion 50 may be exposed (e.g., without being covered by an insulating layer) and may be connected to a flexible film 60 such as a flexible printed circuit board including a controller 70 such as a driver IC chip. As an example, a chip on film (COF) may be connected to the controller 70 through the flexible film 60, but the present invention is not limited thereto. In an exemplary embodiment of the present invention, the controller 70 may be a COP type that is disposed directly on the pad portion 50 of the substrate 100.

The controller 70 may convert a plurality of image signals transmitted from the outside into a plurality of image data signals and may transmit the converted signals to the display area DA through the terminal 51. The controller 70 may receive a vertical synchronization signal, a horizontal synchronization signal, and a clock signal to generate control signals for controlling driving of the first built-in circuit portion 30 and the second built-in circuit portion 40 and may transmit the control signals to the first built-in circuit portion 30 and the second built-in circuit portion 40, respectively, through the third terminal 54. The controller 70 may transmit different voltages to the first power supply voltage line 10 and the second power supply voltage line 20, respectively, through the first and second terminals 52 and 53.

The first power supply voltage line 10 may provide a first power supply voltage ELVDD to each pixel P and the second power supply voltage line 20 may provide a second power supply voltage ELVSS to each pixel P. For example, the first power supply voltage ELVDD may be provided to each pixel P through the driving voltage line PL connected to the first power supply voltage line 10. The second power supply voltage ELVSS may be connected to a cathode of the organic light-emitting diode provided in each pixel P in the peripheral area PA.

In an exemplary embodiment of the present invention, the pad portion 50 may be adjacent to the second side 100b or the fourth side 100d which is relatively longer than the first side 100a of the substrate. Since the pad portion 50 may transmit a data signal generated by the controller 70, the pad portion 50 may be arranged on a long side of the substrate 100 considering a scan-on time, and thus image resolution may be increased. As an example, a portion of a data line for transmitting the data signal to the first display area DA1 and the second display area DA2 of the substrate 100 may be arranged in the peripheral area PA adjacent to the trench portion TH.

In an exemplary embodiment of the present invention, a data line of the first display area DA1 and a data line of the second display area DA2 may be separately provided (e.g., the data line may be spaced apart from each other). Connecting wiring connecting the data lines (e.g., by bridges) may be arranged to overlap the first built-in circuit portion 30. Thus, the size of the peripheral area PA may be reduced. The connecting wiring and the data lines will be described in more detail below.

Figure 2A:
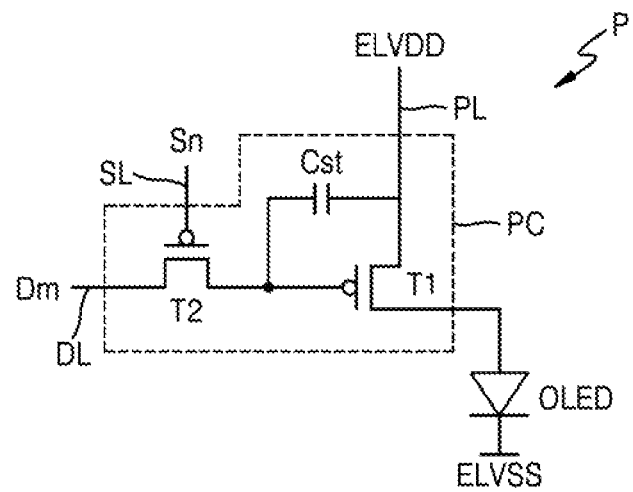
FIGS. 2A and 2B are equivalent circuit diagrams of a pixel in a display device according to an exemplary embodiment of the present invention.
Figure 2B:
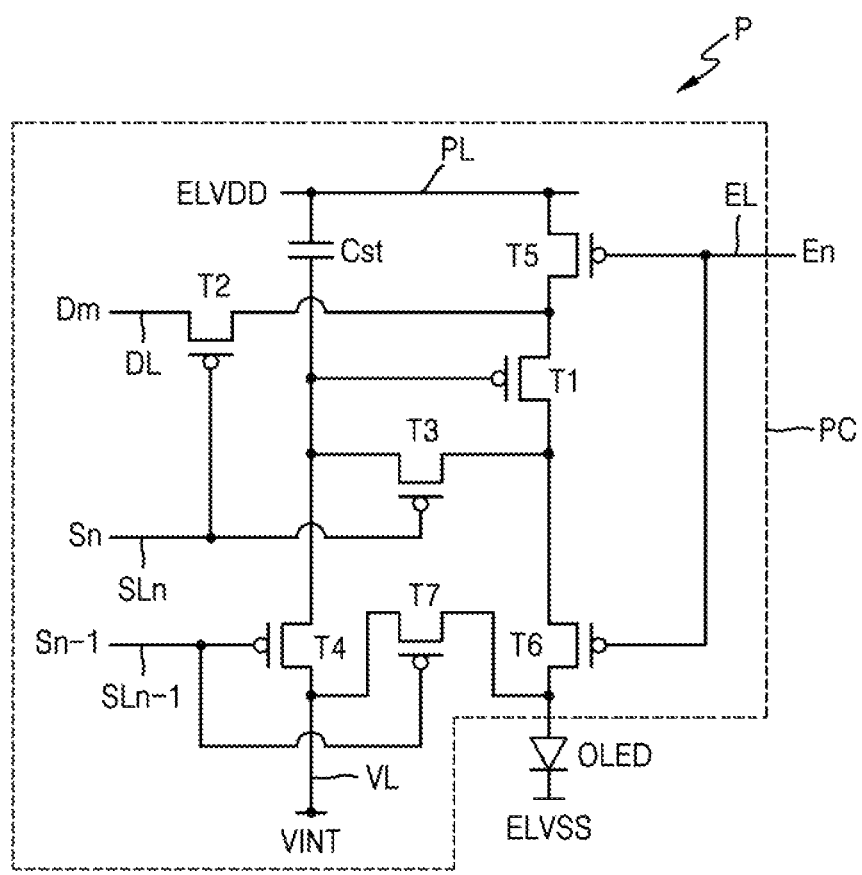

FIGS. 2A and 2B are equivalent circuit diagrams of a pixel in a display device according to an exemplary embodiment of the present invention.

Referring to FIG. 2A, each pixel P may include a pixel circuit PC connected to the scan line SL and the data line DL and an organic light-emitting diode OLED connected to the pixel circuit PC.

The pixel circuit PC may include a driving TFT T1, a switching TFT T2, and a storage capacitor Cst. The switching TFT T2 may be connected to the scan line SL and the data line DL, and may transmit data signal Dm input through the data line DL to the driving TFT T1 according to a scan signal Sn input through the scan line SL.

The storage capacitor Cst may be connected to the switching TFT T2 and the driving voltage line PL, and may store a voltage corresponding to a difference between a voltage supplied from the switching TFT T2 and the first power supply voltage ELVD (or driving voltage) supplied to the driving voltage line PL.

The driving TFT T1 may be connected to the driving voltage line PL and the storage capacitor Cst, and may control a driving current flowing the organic light-emitting diode OLED from the driving voltage line PL corresponding to a voltage value stored in the storage capacitor Cst. The organic light-emitting diode OLED may emit light having predetermined luminance by the driving current.

Although FIG. 2A shows a case where the pixel circuit PC includes two TFTs and one storage TFT, the present invention is not limited thereto.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7.

Although FIG. 2B shows a case where signal lines SLn, SLn−1, EL, and DL, an initialization voltage line VL, and the driving voltage line PL are provided for each pixel, the present invention is not limited thereto. In an exemplary embodiment of the present invention, at least one of the signal lines SLn, SLn−1, EL, and DL, and/or the initialization voltage line VL may be shared by neighboring pixels.

A drain electrode of the driving TFT T1 may be electrically connected to the organic light-emitting diode OLED via the second emission control TFT T6. The driving TFT T1 may receive the data signal Dm according to a switching operation of the switching TFT T2 and may supply a driving current to the organic light-emitting diode OLED.

A gate electrode of the switching TFT T2 may be connected to the scan line SL and a source electrode of the switching TFT T2 may be connected to the data line DL. A drain electrode of the switching TFT T2 may be connected to a source electrode of the driving TFT T1 and may further be connected to the driving voltage line PL via the first emission control TFT T5.

The switching TFT T2 may be turned on in response to a first scan signal Sn received through the first scan line SL and may perform a switching operation for transmitting the data signal Dm transmitted to the data line DL to the source electrode of the driving TFT T1.

A gate electrode of the compensation TFT T3 may be connected to the scan line SLn. A source electrode of the compensation TFT T3 may be connected to the drain electrode of the driving TFT T1 and may further be connected to a pixel electrode of the organic light-emitting diode OLED via the second emission control TFT T6. A drain electrode of the compensation TFT T3 may be connected to any one electrode of the storage capacitor Cst, a source electrode of the first initialization TFT T4, and a gate electrode of the driving TFT T1. The compensation TFT T3 may be turned on in response to the first scan signal Sn received through the scan line SL to connect the gate electrode and the drain electrode of the driving TFT T1 to each other, thus diode-connecting the driving TFT T1.

A gate electrode of the first initialization TFT T4 may be connected to a previous scan line SLn−1, The drain electrode of the first initialization TFT T4 may be connected to the initialization voltage line VL. The source electrode of the first initialization TFT T4 may be connected together to any one electrode of the storage capacitor Cst, the drain electrode of the compensation TFT T3, or the gate electrode of the driving TFT T1. The first initialization TFT T4 may be turned on in response to a second scan signal Sn−1 received through the previous scan line SLn−1 to transmit an initialization voltage VINT to the gate electrode of the driving TFT T1 to perform an initialization operation for initializing a voltage of the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting diode OLED. The first emission control TFT T5 and the second emission control TFT T6 may be substantially simultaneously turned on in response to an emission control signal En received through the emission control line EL so that the first power supply voltage ELVDD is transmitted to the organic light-emitting diode OLED, and a driving current may flow through the organic light-emitting diode OLED.

A gate electrode of the second initialization TFT T7 may be connected to the previous scan line SLn−1. A source electrode of the second initialization TFT T7 may be connected to the pixel electrode of the organic light-emitting diode OLED. A drain electrode of the second initialization TFT T7 may be connected to the initialization voltage line VL. The second initialization TFT T7 may be turned on in response to the second scan signal Sn−1 received through the second scan line SLn−1 to initialize the pixel electrode of the organic light-emitting diode OLED.

Although FIG. 2B shows a case where the first initializing TFT T4 and the second initializing TFT T7 are connected to the previous scan line SLn−1, the present invention is not limited thereto. In an exemplary embodiment of the present invention, the first initialization TFT T4 may be connected to the previous scan line SLn−1 and driven according to the second scan signal Sn−1. The second initialization TFT T7 may be connected to a separate signal line (e.g., next scan line) and may be driven according to a signal transmitted to a corresponding scan line.

The other electrode of the storage capacitor Cst may be connected to the driving voltage line PL. Any one electrode of the storage capacitor Cst may be connected together to the gate electrode of the driving TFT T1, the drain electrode of the compensation TFT T3, and the source electrode of the first initialization TFT T4.

An opposite electrode (e.g., a cathode) of the organic light-emitting diode OLED may be supplied with the second power supply voltage ELVSS (or a common power supply voltage). The organic light-emitting diode OLED may receive a driving current from the driving TFT T1 and may emit light.

The pixel circuit PC is not limited to a circuit design and the number of TFTs and storage capacitors described with reference to FIGS. 2A and 2B, and the number and the circuit design may vary, as desired.

A display device according to an exemplary embodiment of the present invention will be described in more detail below with reference to FIGS. 3 to 5.

Figure 3:
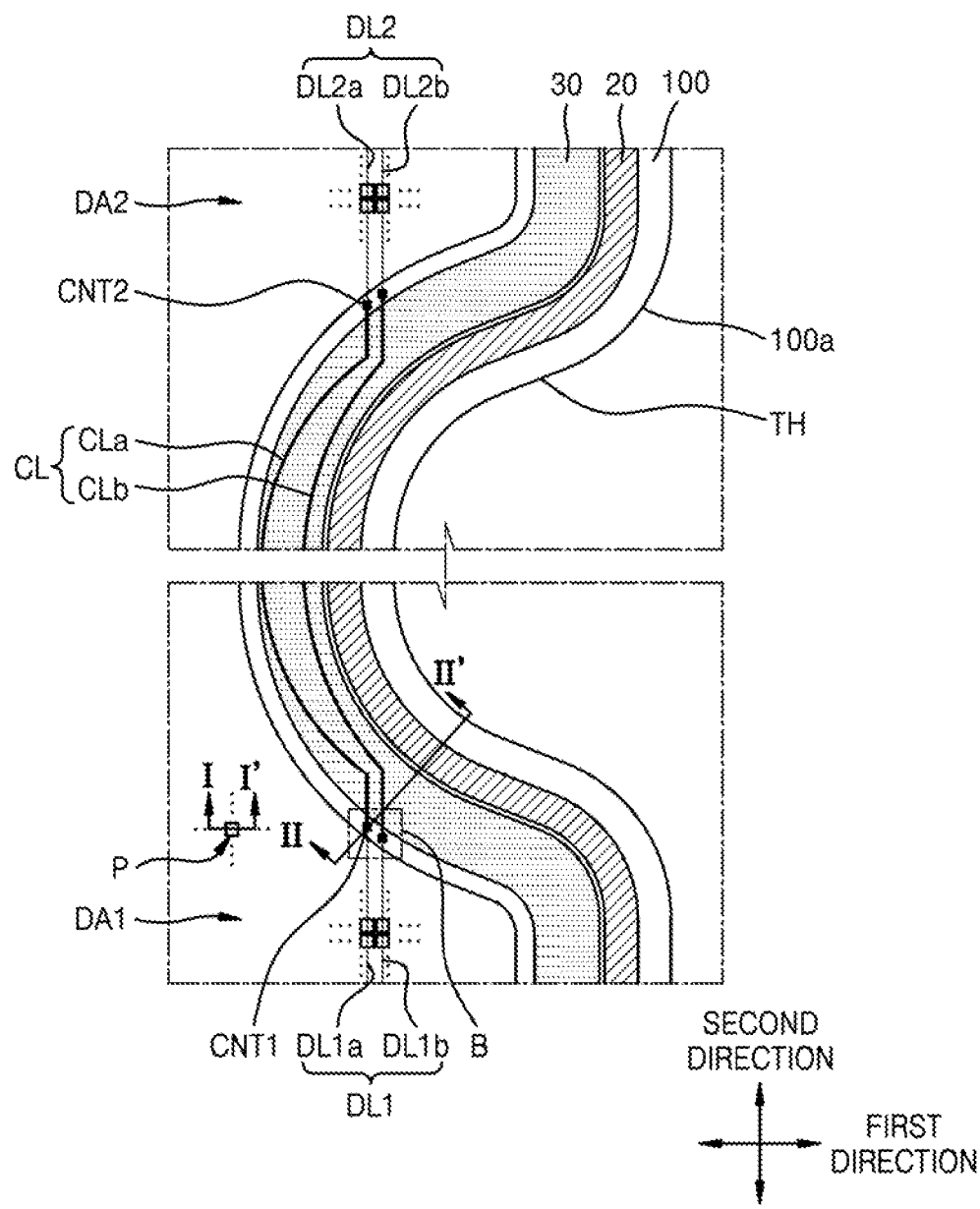
FIG. 3 is an enlarged plan view of a portion of a display device according to an exemplary embodiment of the present invention, which corresponds to portion A of FIG. 1.

FIG. 3 is an enlarged plan view of a portion of a display device according to an exemplary embodiment of the present invention, which corresponds to portion A of FIG. 1. FIG. 4 is an enlarged plan view of portion B of FIG. 3.

Figure 4:
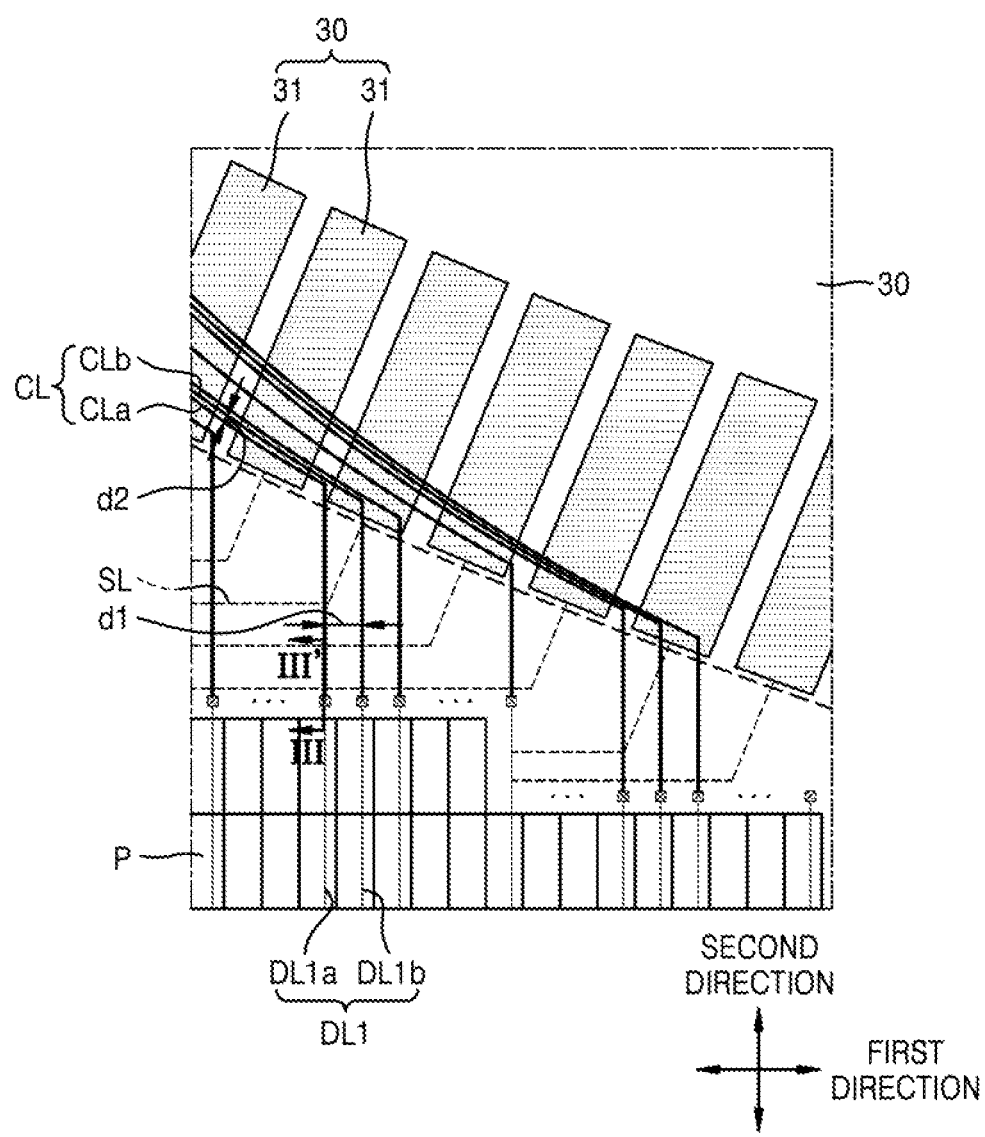
FIG. 4 is an enlarged plan view of portion B of FIG. 3.

Referring to FIGS. 3 and 4, the display device according to an exemplary embodiment of the present invention may include the substrate 100 having the trench portion TH which may be recessed into the substrate 100 at a first side, the first built-in circuit portion 30 adjacent to the trench portion TH, a first wire DL1 in the first display area DA1, a second wire DL2 in the second display area DA2, and a connecting wiring CL for connecting the first wire DL1 to the second wire DL2 and overlapping the first built-in circuit portion 30.

The first built-in circuit portion 30 may be arranged adjacent to the first side 100a of the substrate 100, for example, adjacent to the trench portion TH, and may be between the display area DA and the second power supply voltage line 20. The first built-in circuit portion 30 may be curved along the shape of the trench portion TH. Alternatively, the first built-in circuit portion 30 may be curved along the shape of the display area DA. As an example, the first built-in circuit portion 30 may be curved along shapes of the first display area DA1 and the second display area DA2 protruding in the first direction, or a shape in which one corner of the display area DA is rounded.

The first built-in circuit portion 30 may include a scan driver. As an example, the first built-in circuit portion 30 may generate a scan signal to be provided to the pixels P of the display area DA. As an example, the first built-in circuit portion 30 may include a plurality of stages 31 for sequentially outputting a control signal (e.g., a scan signal or an emission control signal). A stage 31 may include at least one TFT and/or capacitor. A control signal generated in the stage 31 may be transmitted to the pixels P of the display area DA through scan lines SL. As an example, the scan lines SL may be connected to the first built-in circuit portion 30 and extend to the display area DA. The scan lines SL may be arranged in a layer different from those of connecting wiring CL and may intersect with the connecting wiring CL. In this specification, the stage 31 may refer to a unit for generating a control signal.

The first wire DL1 may function as a data line extending along the second direction on the first display area DA1 and transmitting data signals to the pixels P arranged in the first display area DA1. As an example, an end of the first wire DL1 may be electrically connected to a terminal of the pad portion 50 (see, e.g., FIG. 1) to receive a data signal supplied from the controller 70.

The second wire DL2 may function as a data line extending along the second direction on the second display area DA2 and transmitting data signals to the pixels P arranged in the second display area DA2. The second wire DL2 may be connected to the first wire DL1 through the connecting wiring CL and may transmit data signals received from the first wire DL1 to the pixels P of the second display area DA2.

However, the invention is not limited thereto. In an exemplary embodiment of the present invention, the first wire DL1 and the second wire DL2 may function as a driving voltage line. In an exemplary embodiment of the present invention, the first wire DL1 and the second wire DL2 may function as a scan line for transmitting a scan signal.

The first wire DL1 and the second wire DL2 may be spaced apart from each other with the trench portion TH therebetween. The connecting wiring CL may connect the first wire DL1 to the second wire DL2. The connecting wiring CL may be arranged in the peripheral region PA adjacent to the trench portion TH and curved along the shape of the trench portion TH. Alternatively, the connecting wiring CL may be curved along the shape of the display area DA.

The connecting wiring CL may be provided in a layer different from those of the first wire DL1 and the second wire DL2 so that the first wire DL1 and the second wire DL2 may be bridged. As an example, an end of the connecting wiring CL may be connected to the first wire DL1 through a first contact hole CNT1 and another end of the connecting wiring CL may be connected to the second wire DL2 through a second contact hole CNT2.

The first wire DL1 may be provided in a multiple number and may include a $1a^{th}$ wire DL1a and a $1b^{th}$ wire DL1b that are adjacent to each other. The second wire DL2 may be provided in a multiple number and may include a $2a^{th}$ wire DL2a and a $2b^{th}$ wire DL2b that are adjacent to each other. The $1a^{th}$ wire DL1a and the $2a^{th}$ wire DL2a may be connected to each other by a first connecting wiring CLa, and the $1b^{th}$ wire DL1b and the $2b^{th}$ wire DL2b may be connected to each other by a second connecting wiring CLb. The curved shapes of the first connecting wiring CLa and the second connecting wiring CLb may be different from each other. For example, the degree of the curvature of the first connecting wiring CLa further adjacent to the display area DA may be greater than that of the second connecting wiring CLb.

The connecting wiring CL may be arranged at least partially overlapping the first built-in circuit portion 30. The connecting wiring CL may be provided in a layer different from that of the first built-in circuit portion 30, and may overlap the stage 31 in the first built-in circuit portion 30. Further, the connecting wiring CL may overlap the TFT or the capacitor in the stage 31.

Referring to FIG. 4, a portion of the connecting wiring CL may extend substantially linearly in the second direction in a region not overlapping the first built-in circuit portion 30 and may be curved along the shape of the trench portion TH from a region overlapping the first built-in circuit portion 30. A shortest distance d1 between the adjacent first connecting wiring CLa and the second connecting wiring CLb in the region not overlapping the first built-in circuit portion 30 may be greater than a shortest distance d2 in the region overlapping the first built-in circuit portion 30.

The plurality of connecting wiring CL may be arranged to overlap the stage 31 included in the first built-in circuit portion 30. A plurality of TFTs may be included in the stage 31.

A dead space of the peripheral area PA may be minimized by an arrangement relationship between the connecting wiring CL and the first built-in circuit portion 30.

A display device according to an exemplary embodiment of the present invention will be described in more detail below with reference to FIGS. 5 and 6. FIG. 5 is a cross-sectional view taken along line I-I' and line II-II' of FIG. 3, and FIG. 6 is a cross-sectional view taken along line III-III' of FIG. 4.

Figure 5:
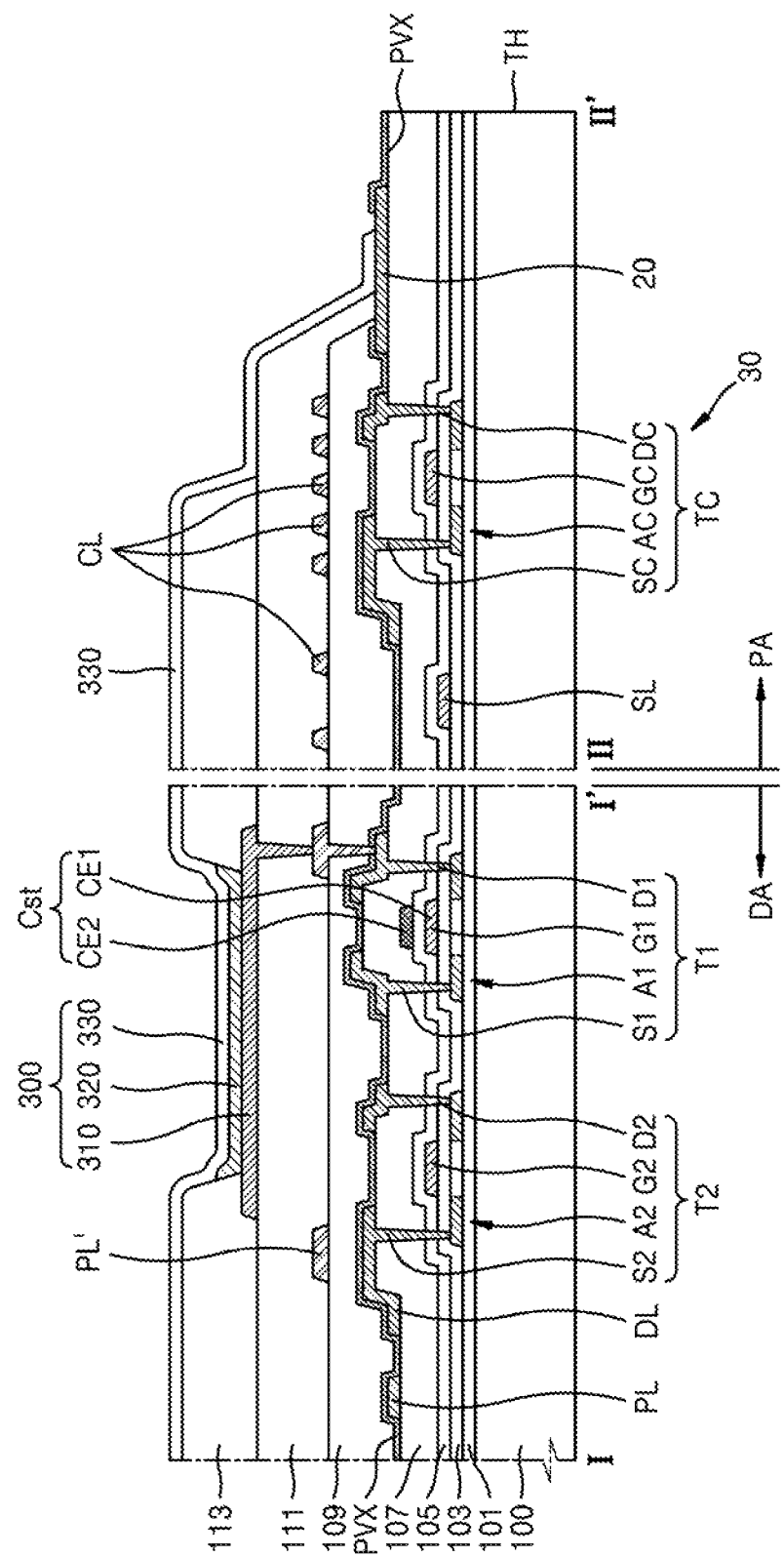
FIG. 5 is a cross-sectional view taken along line I-I' and line II-II' of FIG. 3.
Figure 6:
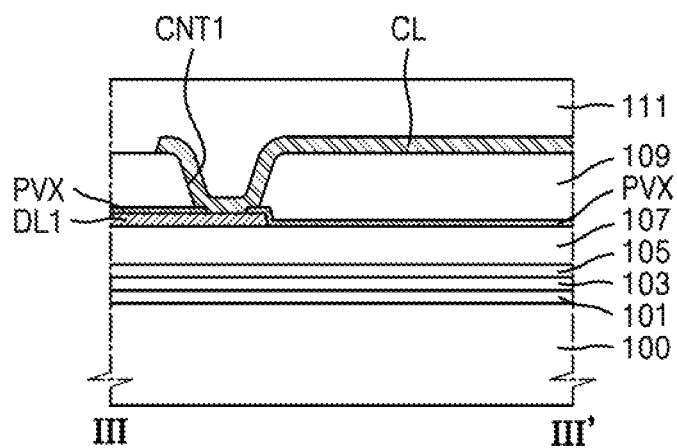
FIG. 6 is a cross-sectional view taken along line III-III' of FIG. 4.

Referring to FIG. 5, the pixel P may be arranged in the display area DA, and the first built-in circuit portion 30 and the connecting wiring CL overlapping the first built-in circuit portion 30 may be arranged in the peripheral area PA adjacent to the trench portion TH.

Referring to the display area DA, a buffer layer 101 may be disposed on the substrate 100, and the driving and switching TFTs T1 and T2 and the storage capacitor Cst may be above the buffer layer 101.

The substrate 100 may include various materials such as a glass material or a plastic material such as polyethylene terephthalate (PET), polyethylene naphthalate (PEN), or polyimide. When the substrate 100 includes a plastic material, the flexibility may be further increased as compared with a case where the substrate 100 includes a glass material. The buffer layer 101 including silicon oxide (SiOx) and/or silicon nitride (SiNx) formed to prevent penetration of impurities may be provided on the substrate 100. For example, the display device may be a bendable or foldable display device that is in a curved or bent state at some times and is in a substantially flat state at other times. Alternatively, the display device may be in a permanently folded, curved or bent state.

The driving TFT T1 may include a driving semiconductor layer A1 and a driving gate electrode G1 and the switching TFT T2 may include a switching semiconductor layer A2 and a switching gate electrode G2. A first gate insulating layer 103 may be between the driving semiconductor layer A1 and the driving gate electrode G1 and between the switching semiconductor layer A2 and the switching gate electrode G2. The first gate insulating layer 103 may include an inorganic insulating material such as SiOx, SiNx, or silicon oxynitride (SiON).

The driving semiconductor layer A1 and the switching semiconductor layer A2 may include amorphous silicon or polysilicon. In an exemplary embodiment of the present invention, the driving semiconductor layer A1 and the switching semiconductor layer A2 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). The driving semiconductor layer A1 includes a driving channel region overlapping the driving gate electrode G1 (e.g., along the third direction orthogonal to the first and second directions) and not doped with impurities, and a driving source region and a driving drain region doped with impurities on both sides of the driving channel region. A driving source electrode S1 and a driving drain electrode D1 may be connected to the driving source region and the driving drain region, respectively. The driving semiconductor layer A1 and the switching semiconductor layer A2 may be formed as a single layer or multiple layers.

The switching semiconductor layer A2 may include a switching channel region overlapped with the switching gate electrode G2 and not doped with impurities, and a switching source region and a switching drain region doped with impurities on opposite sides of the switching channel region. A switching source electrode S2 and a switching drain electrode D2 may be connected to the switching source region and the switching drain region, respectively.

Each of the gate electrodes G1 and G2 may include molybdenum (Mo), aluminum (Al), copper (Cu), or titanium (Ti) and may be formed as a single layer or multiple layers. For example, each of the driving and switching gate electrodes G1 and G2 may be a single layer including Mo.

Each of the source electrodes S1 and S2 and the drain electrodes D1 and D2 may include Mo, Al, Cu, or Ti and may be formed as a single layer or multiple layers including the above materials. For example, each of the source electrodes S1 and S2 and the drain electrodes D1 and D2 may have a multilayer structure of Ti/Al/Ti.

In an exemplary embodiment of the present invention, the storage capacitor Cst may overlap the driving TFT T1 (e.g., along the third direction orthogonal to the first and second directions). In this case, an area of the storage capacitor Cst and the driving TFT T1 may be increased and a relatively high quality image may be provided. For example, the driving gate electrode G1 may be a first storage capacitor plate CE1 of the storage capacitor Cst. A second storage capacitor plate CE2 may overlap the first storage capacitor plate CE1 with a second gate insulating layer 105 disposed between the second storage capacitor plate CE2 and the first storage capacitor plate CE1. The second gate insulating layer 105 may include an inorganic insulating material such as SiOx, SiNx, and SiON.

The driving and switching TFTs T1 and T2 and the storage capacitor Cst may be substantially covered with an interlayer insulating layer 107. The interlayer insulating layer 107 may include an inorganic insulating material such as SiON, SiOx and/or SiNx. The data line DL and the driving voltage line PL may be on the interlayer insulating layer 107. The data line DL may be connected to the switching semiconductor layer A2 of the switching TFT T2 through a contact hole penetrating the interlayer insulating layer 107. The data line DL may serve as the switching source electrode S2. The driving source electrode S1, the driving drain electrode D1, the switching source electrode S2, and the switching drain electrode D2 may be on the interlayer insulating layer 107. The driving source electrode S1, the driving drain electrode D1, the switching source electrode S2, and the switching drain electrode D2 may be connected to the driving semiconductor layer A1 or the switching semiconductor layer A2 through the contact hole penetrating the interlayer insulating layer 107.

The driving voltage line PL, the data line DL, the driving source electrode S1, the driving drain electrode D1, the switching source electrode S2, and the switching drain electrode D2 may be substantially covered with an inorganic protective layer PVX.

The inorganic protective layer PVX may be a single layer or multiple layers including SiNx and/or SiOx. The inorganic protective layer PVX may substantially cover and protect some of wiring exposed in a non-display area NDA. Wiring and/or a conductive layer formed together in the same operation as that of the data line DL or the driving voltage line PL may be exposed in a portion of the substrate 100 (e.g., a portion of the peripheral area PA). The exposed portion of the wiring and/or the conductive layer may be damaged by an etchant used in patterning a pixel electrode 310 described in more detail below. Since the inorganic protective layer PVX substantially covers the data line DL and at least a portion of the wiring formed together with the data line DL, the wiring and/or the conductive layer may be prevented from being damaged in the patterning process of the pixel electrode 310.

A first planarization layer 109 and a second planarization layer 111 may be planarization insulating layers, and may include organic materials. The organic materials may include a polymer such as polymethylmethacrylate (PMMA) or polystyrene (PS), a polymer derivative including a phenolic group, an acrylic polymer, an aryl ether polymer, an amide polymer, a fluorine-based polymer, a p-xylene-based polymer, a vinyl alcohol polymer, or a blend thereof. Alternatively, the first planarization layer 109 and the second planarization layer 111 may include an inorganic material such as SiON, SiOx, and/or SiNx. In an exemplary embodiment of the present invention, upper portions of the first planarization layer 109 and the second planarization layer 111 may be planarized by chemical mechanical polishing.

An additional driving voltage line PL' may be on the first planarization layer 109. The additional driving voltage line PL' may be a single layer or multiple layers including at least one of Al, Cu, Ti, or an alloy thereof. In an exemplary embodiment of the present invention, the additional driving voltage line PL' may be a three-layer of Ti/Al/Ti. The additional driving voltage line PL' may be connected to the driving voltage line PL through a contact hole formed in the first planarization layer 109 to reduce resistance.

The organic light-emitting diode OLED may be on the second planarization layer 111, the organic light-emitting diode OLED having the pixel electrode 310, an opposite electrode 330, and an intermediate layer 320 disposed therebetween and including an emission layer.

A pixel defining layer 113 may be on the pixel electrode 310. The pixel defining layer 113 may have an opening for exposing the pixel electrode 310 to define a light-emitting region of pixels. In addition, the pixel defining layer 113 may increase a distance between an edge of the pixel electrode 310 and the opposite electrode 330, thus preventing generation of an arc therebetween. The pixel defining layer 113 may include an organic material such as polyimide or hexamethyldisiloxane (HMDSO).

The intermediate layer 320 may include a relatively low-molecular weight material or a relatively high-molecular weight material. When the intermediate layer 320 includes a low-molecular weight material, the intermediate layer 320 may have a single or composite structure by stacking a hole injection layer (HIL), a hole transport layer (HTL), an emission layer (EML), an electron transport layer (ETL), or an electron injection layer (EIL). The intermediate layer 320 may include various organic materials, such as copper phthalocyanine (CuPc), N,N'-Di(naphthalene-1-yl)-N,N'-diphenyl-benzidine (NPB), or tris-8-hydroxyquinoline aluminum (Alq3). The layers may be formed by an evaporation method.

When the intermediate layer 320 includes a high-molecular weight material, the intermediate layer 320 may have a structure including an HTL and an EML. The HTL may include poly(3,4-ethylenedioxythiophene) (PEDOT) and the EML may include a relatively high-molecular weight material such as poly-phenylenevinylene (PPV) and polyfluorene. However, the intermediate layer 320 is not limited thereto, and may have various structures, as desired. For example, the intermediate layer 320 may include an integral layer over the entire plurality of the pixel electrodes 310 or may have layers patterned to correspond to each of the pixel electrodes 310.

The opposite electrode 330 may be formed over the display area DA to substantially cover the display area DA. The opposite electrode 330 may be integrally formed over a plurality of organic light-emitting devices OLEDs to correspond to the plurality of the pixel electrodes 310. The opposite electrode 330 may extend to the peripheral region PA and may be connected to the second power supply voltage line 20.

The first built-in circuit portion 30 may be arranged in the peripheral region PA and may include at least one peripheral TFT TC.

The peripheral TFT TC may include a peripheral semiconductor layer AC and a peripheral gate electrode GC. The first gate insulating layer 103 may be located between the peripheral semiconductor layer AC and the peripheral gate electrode GC. The first gate insulating layer 103 may include an inorganic insulating material such as SiOx, SiNx, or SiON. The peripheral semiconductor layer AC may be arranged in a same layer as the driving semiconductor layer A1 and the switching semiconductor layer A2.

The peripheral semiconductor layer AC may include amorphous silicon or polysilicon. In an exemplary embodiment of the present invention, the peripheral semiconductor layer AC may include an oxide of at least one of In, Ga, Sn, Zr, V, Hf, Cd, Ge, Cr, Ti, Al, Cs, Ce, or Zn. The peripheral semiconductor layer AC may include a peripheral channel region overlapping the peripheral gate electrode GC and not doped with impurities, and a peripheral source region and a peripheral drain region doped with impurities on opposite sides of the peripheral channel region. A peripheral source electrode SC and a peripheral drain electrode DC may be connected to the peripheral source region and the peripheral drain region, respectively. The peripheral semiconductor layer AC may be a single layer or multiple layers.

The peripheral gate electrode GC includes Mo, Al, Cu, or Ti and may be formed as a single layer or multiple layers. For example, the peripheral gate electrode GC may be a single layer including Mo. The peripheral gate electrode GC may be provided in a same layer as that of the driving and switching gate electrodes G1 and G2 and may include a same material as that of the driving and switching gate electrodes G1 and G2.

The scan line SL may be provided in a same layer as that of the peripheral gate electrode GC and may include a same material as that of the peripheral gate electrode GC. The scan line SL may transmit a signal generated by the first built-in circuit portion 30 to the display area DA.

The peripheral gate electrode GC may be substantially covered with the second gate insulating layer 105 and the interlayer insulating layer 107. The peripheral source electrode SC and the peripheral drain electrode DC may be over the interlayer insulating layer 107 and may be connected to the peripheral semiconductor layer AC penetrating the interlayer insulating layer 107, the second gate insulating layer 105, and the first gate insulating layer 103. The peripheral gate electrode GC may be substantially covered with the inorganic protective layer PVX. The first planarization layer 109 may be on the inorganic protective layer PVX.

In the peripheral area PA, the plurality of connecting wiring CL may overlap the first built-in circuit portion 30 on the first planarization layer 109 (e.g., along the third direction orthogonal to the first and second directions). The plurality of connecting wiring CL may overlap the peripheral TFT TC (e.g., along the third direction orthogonal to the first and second directions). A partial region of the connecting wiring CL might not overlap the first built-in circuit portion 30. The plurality of connecting wiring CL may be provided in a same layer as that of the additional driving voltage line PL' and may include a same material as that of the additional driving voltage line PL'. The plurality of connecting wiring CL may be substantially covered with the second planarization layer 111. In an exemplary embodiment of the present invention, the second planarization layer 111 may substantially cover a side surface of the first planarization layer 109. However, the present invention is not limited thereto. The second planarization layer 111 may be arranged only over the first planarization layer 109 and end portions of the first planarization layer 109 and the second planarization layer 111 may be formed in a stepped shape.

The second power supply voltage line 20 may be arranged adjacent to an edge of the substrate 100 in the peripheral area PA. The first built-in circuit portion 30 may be between the display area DA and the second power supply voltage line 20. The second power supply voltage line 20 may be provided in a same layer as that of the data line DL, the driving voltage line PL, the source electrodes S1, S2, and SC, or the drain electrodes D1, D2, and DC, and may include a same material as that of the data line DL, the driving voltage line PL, the source electrodes S1, S2, and SC, or the drain electrodes D1, D2, and DC. The second power supply voltage line 20 may include a conductive material such as Mo, Al, Cu, or Ti and may be formed as a single layer or multiple layers including the above material. For example, the second power supply voltage line 20 may have a multilayer structure of Ti/Al/Ti.

The second power supply voltage line 20 may be connected to the opposite electrode 330 and may transmit the second power supply voltage ELVSS to the opposite electrode 330. The opposite electrode 330 may be integrally provided in a plurality of pixels, and an end of the opposite electrode 330 may be connected to the second power supply voltage line 20. As an example, the opposite electrode 330 and the second power supply voltage line 20 may be directly in contact with each other, but the present invention is not limited thereto. For example, a conductive layer may be provided between the opposite electrode 330 and the second power supply voltage line 20, and the opposite electrode 330 and the second power supply voltage line 20 may be connected to each other with the conductive layer therebetween.

Referring to FIG. 6, the first wire DL1 and the connecting wiring CL may be provided in different layers and connected to each other through the first contact hole CNT1.

The first wire DL1 may be on the interlayer insulating layer 107. The first wire DL1 may be provided in a same layer as that of the data line DL, the driving voltage line PL, the source electrodes S1 and S2, and/or the drain electrodes D1 and D2, and may include a same material as that of the data line DL, the driving voltage line PL, the source electrodes S1 and S2, and/or the drain electrodes D1 and D2. The connecting wiring CL may be on the first planarization layer 109 and connected to the first wire DL1 through the first contact hole CNT1 penetrating the first planarization layer 109 and the inorganic protective layer PVX. The connecting wiring CL may be substantially covered by the second planarization layer 111.

Since a display device according to an exemplary embodiment of the present invention has the pad portion 50 on a long side of the substrate 100 and the first built-in circuit portion 30 adjacent to the trench portion TH of the substrate 100, the display device may realize a relatively high-quality image. In addition, a dead space of the peripheral area PA may be reduced by overlapping the first built-in circuit portion 30 and the connecting wiring CL (e.g., along the third direction orthogonal to the first and second directions).

Figure 7:
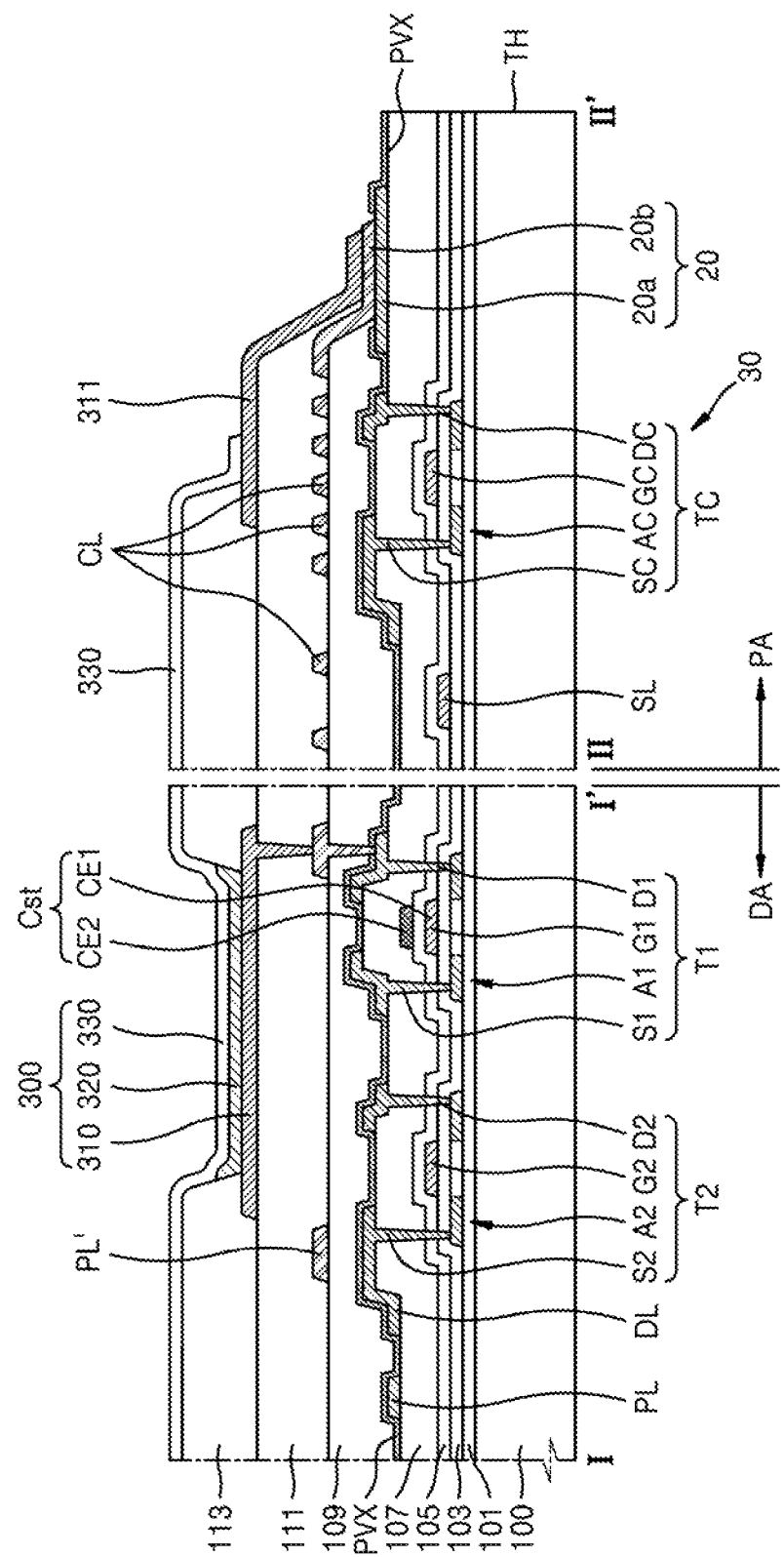
FIG. 7 is a cross-sectional view of a display device according to an exemplary embodiment of the present invention.

FIG. 7 is a cross-sectional view of a display device according to an exemplary embodiment of the present invention. In FIG. 7, the same reference numerals in FIG. 5 denote the same elements, and duplicate description thereof may be omitted.

Referring to FIG. 7, the TFTs T1 and T2 and the organic light-emitting device OLED as a display element may be arranged in the display area DA of the display device, and the first built-in circuit portion 30 and the connecting wiring CL overlapping the first built-in circuit portion 30 (e.g., along the third direction orthogonal to the first and second directions) may be arranged in the peripheral area PA adjacent to the trench portion TH of the substrate 100.

The first built-in circuit portion 30 may include at least one peripheral TFT TC, and the connecting wiring CL at least partially overlapping the peripheral TFT TC (e.g., along the third direction orthogonal to the first and second directions). The connecting wiring CL may be arranged on the first planarization layer 109 substantially covering the TFTs T1 and T2 of the display area DA and the peripheral TFT TC of the peripheral area PA to transmit a data signal or a driving voltage.

In an exemplary embodiment of the present invention, the second power supply voltage line 20 may be formed by stacking a first layer 20a and a second layer 20b. The first layer 20a may be provided in a same layer as that of the data line DL, the source electrodes S1 and S2, and the drain electrodes D1 and D2 arranged in the display area DA and including a same material as that of the data line DL, the source electrodes S1 and S2, and the drain electrodes D1 and D2. The second layer 20b may be provided in a same layer as that of the connecting wiring CL and may include a same material as that of the connecting wiring CL. Resistivity of the second power supply voltage line 20 may be lowered by providing the second power supply voltage line 20 in a double layer. Thus, voltage drop of the second power supply voltage line 20 may be minimized. In addition, a width of the second power supply voltage line 20 may be reduced, and a size of the peripheral area PA may be reduced.

In an exemplary embodiment of the present invention, a conductive layer 311 including a same material as that of the pixel electrode 310 may be between the second power supply voltage line 20 and the opposite electrode 330. The conductive layer 311 may extend from an upper portion of the second planarization layer 111 along a side surface of the second planarization layer 111 to directly contact the second power supply voltage line 20. The opposite electrode 330 may be in direct contact with the conductive layer 311 to be electrically connected to the second power supply voltage line 20.

The display device according to an exemplary embodiment of the present invention may reduce the dead space of the peripheral area PA while realizing a relatively high-quality image by arranging the first built-in circuit portion 30 adjacent to the trench portion TH of the substrate 100 and overlapping the first built-in circuit portion 30 and the connecting wiring CL (e.g., along the third direction orthogonal to the first and second directions).

Figure 8A:
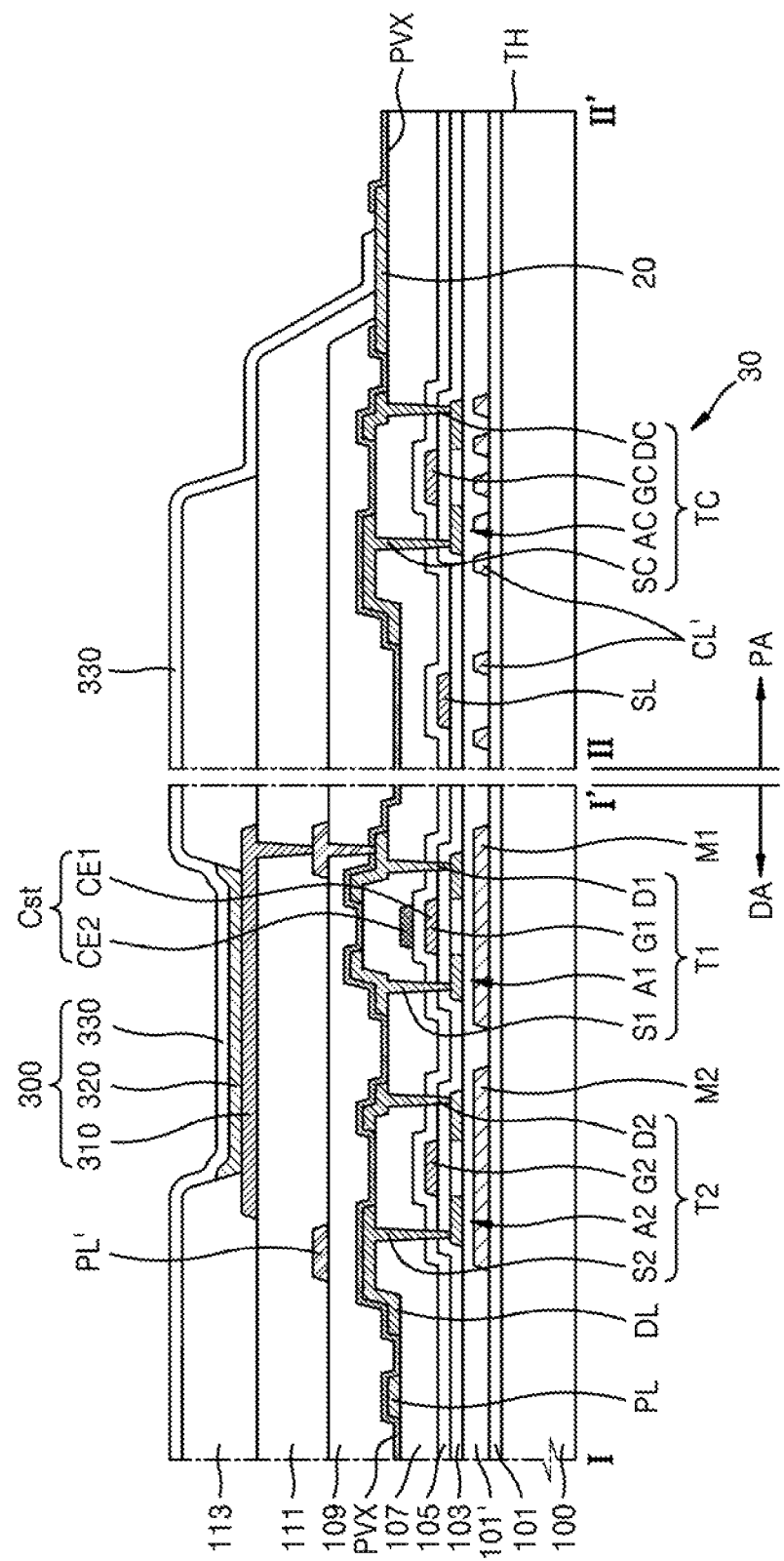
FIGS. 8A and 8B are cross-sectional views of portions of a display device according to an exemplary embodiment of the present invention.
Figure 8B:
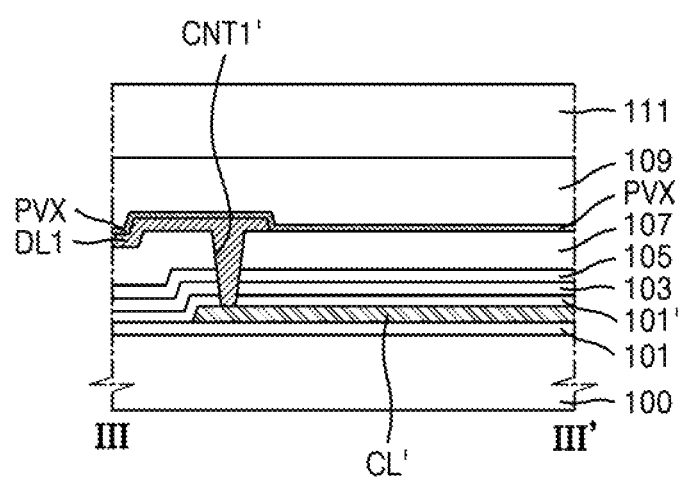

FIGS. 8A and 8B are cross-sectional views of a display device according to an exemplary embodiment of the present invention. In FIGS. 8A and 8B, the same reference numerals as in FIGS. 5 and 6 denote the same elements, and duplicate description thereof may be omitted.

Referring to FIGS. 8A and 8B, the TFTs T1 and T2 and the organic light-emitting device OLED as a display element may be arranged in the display area DA of the display device, and the first built-in circuit portion 30 and connecting wiring CL' overlapping the first built-in circuit portion 30 may be arranged in the peripheral area PA adjacent to the trench portion TH of the substrate 100.

The first built-in circuit portion 30 may include at least one peripheral TFT TC, and the connecting wiring CL' may at least partially overlap the peripheral TFT TC. A connecting wiring CL' may be arranged below the peripheral TFT TC of the peripheral area PA to transmit a data signal or a driving voltage.

In an exemplary embodiment of the present invention, lower metal layers M1 and M2 may be further arranged below the semiconductor layers A1 and A2 in the display area DA to correspond to the semiconductor layers A1 and A2. The lower metal layers M1/ and M2 may be between the substrate 100 and the semiconductor layers A1 and A2 to shield light that may be incident on the semiconductor layers A1 and A2. The lower metal layers M1 and M2 may include Mo, Al, Cu, or Ti and may be a single layer or multiple layers.

The lower metal layers M1 and M2 may be on the buffer layer 101. An insulating layer 101' may be between the lower metal layers M1 and M2 and the semiconductor layers A1 and A2. The insulating layer 101' may include silicon oxide ($SiO_2$), Silicon nitride (SiN), silicon oxynitride (SiON), aluminum oxide ($Al_2O_3$), tantalum oxide ($Ta_2Os$), hafnium oxide ($HfO_2$), or zinc oxide ($ZrO_2$).

Characteristics of the semiconductor layers A1 and A2 may be changed by light. The change in characteristics of the semiconductor layers A1 and A2 may lead to a change in characteristics of the TFTs T1 and T2. In an exemplary embodiment of the present invention, the characteristics of the TFTs T1 and T2 may be stabilized without being changed by an external light by introducing the lower metal layers M1 and M2.

In an exemplary embodiment of the present invention, a voltage may be applied to the lower metal layers M1 and M2. For example, a driving voltage may be applied to the lower metal layers M1 and M2 and may be connected to the source electrodes S1 and S2, the drain electrodes D1 and D2, or the gate electrodes G1 and G2 of the TFT so that a voltage interlocking with them may be applied. Thus, the characteristics of the TFTs T1 and T2 may be stabilized.

In an exemplary embodiment of the present invention, the connecting wiring CL' may be provided in a same layer as that of the lower metal layers M1 and M2 and may include a same material as that of the lower metal layers M1 and M2. The connecting wiring CL' may be arranged with the peripheral TFT TC included in the first built-in circuit portion 30 with an insulating layer 101' therebetween. Since the connecting wiring CL' is arranged below the first built-in circuit portion 30, the first wire DL1 may be in direct contact with the connecting wiring CL' through a contact hole CNT1' penetrating the interlayer insulating layer 107, the second gate insulating layer 105, the first gate insulating layer 103, and the insulating layer 101'.

The display device according to an exemplary embodiment of the present invention may reduce the dead space of the peripheral area PA while realizing a relatively high-quality image by arranging the first built-in circuit portion 30 adjacent to the trench portion TH of the substrate 100 and overlapping the first built-in circuit portion 30 and the connecting wiring CL' (e.g., along the third direction orthogonal to the first and second directions).

Figure 9:
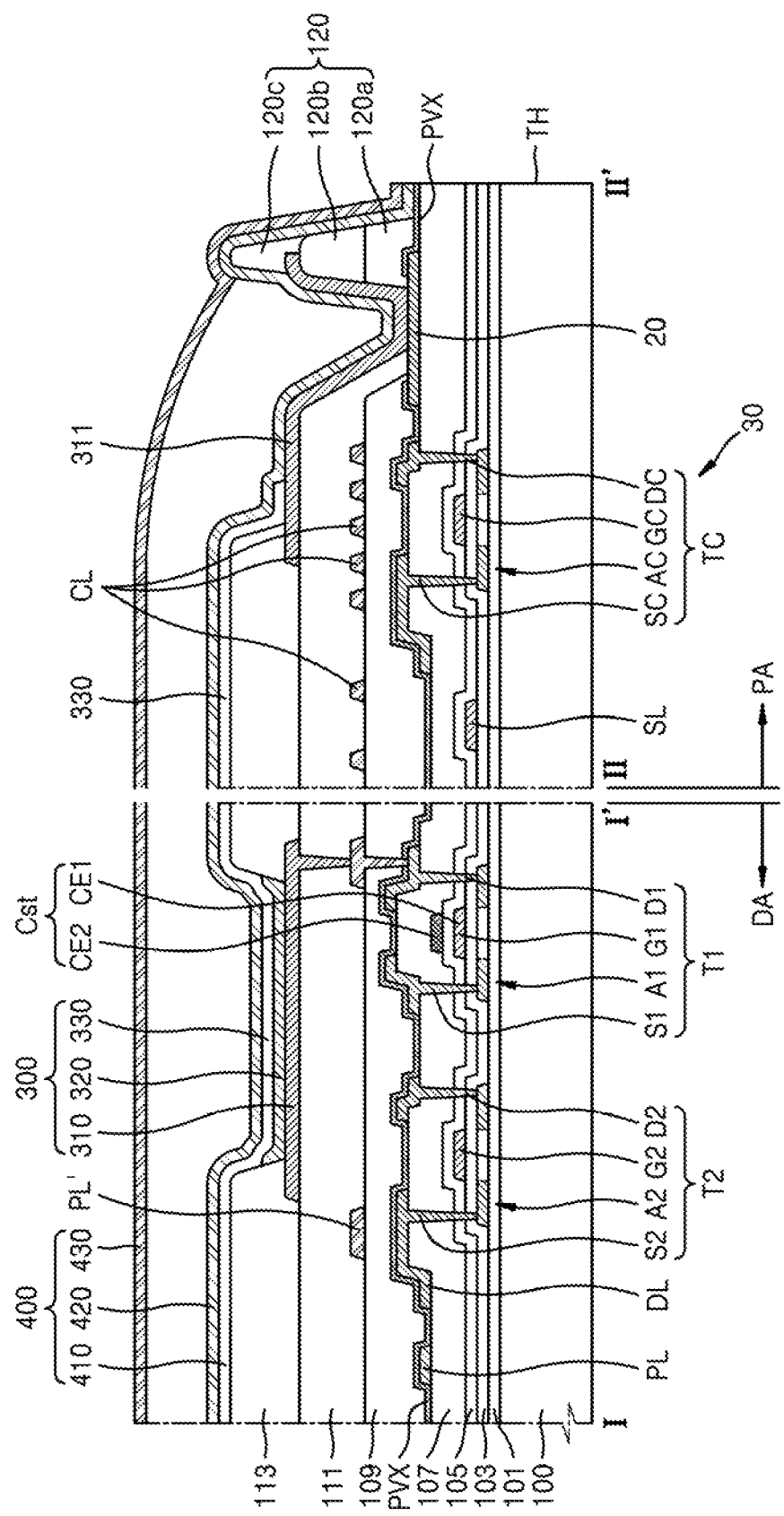
FIG. 9 is a cross-sectional view of a portion of a display device according to an exemplary embodiment of the present invention.

FIG. 9 is a cross-sectional view of a display device according to an exemplary embodiment of the present invention. In FIG. 9, the same reference numerals in FIG. 5 denote the same elements, and duplicate description thereof may be omitted.

Referring to FIG. 9, the TFTs T1 and T2 and the organic light-emitting device OLED as a display element may be arranged in the display area DA of the display device, and the first built-in circuit portion 30 and the connecting wiring CL overlapping the first built-in circuit portion 30 (e.g., along the third direction orthogonal to the first and second directions) may be arranged in the peripheral area PA adjacent to the trench portion TH of the substrate 100.

The first built-in circuit portion 30 may include at least one peripheral TFT TC, and the connecting wiring CL at least partially overlapping the peripheral TFT TC (e.g., along the third direction orthogonal to the first and second directions). The connecting wiring CL may be arranged below the peripheral TFT TC of the peripheral area PA to transmit a data signal or a driving voltage.

In an exemplary embodiment of the present invention, the display device may further include a thin-film encapsulation layer 400 for sealing the display area DA to prevent a display element from being damaged by moisture or oxygen from the outside.

The thin-film encapsulation layer 400 may substantially cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, the organic encapsulation layer 420, and a second inorganic encapsulation layer 430.

The first inorganic encapsulation layer 410 may substantially cover the opposite electrode 330 and may include SiOx, SiNx, and/or SiON. As an example, other layers such as a capping layer may be between the first inorganic encapsulation layer 410 and the opposite electrode 330. A shape of the first inorganic encapsulation layer 410 may be formed along the shape of a structure therebelow, and thus, an upper surface thereof might not be flat. The organic encapsulation layer 420 may substantially cover the first inorganic encapsulation layer 410. However, an upper surface of the organic encapsulation layer 420 may be formed as generally flat. As an example, the upper surface of the organic encapsulation layer 420 corresponding to the display area DA may be approximately flat. The organic encapsulation layer 420 may include at least one selected from PET, PEN, polycarbonate (PC), polyimide (PI), polyethersulphone (PES), polyoxymethylene (POM), polyacrylate (PAR), or HMDSO. The second inorganic encapsulation layer 430 may substantially cover the organic encapsulation layer 420 and may include SiOx, SiNx, and/or SiON.

If a crack occurs in the thin-film encapsulation layer 400 through the above-described multilayer structure, the crack might not be connected between the first inorganic encapsulation layer 410 and the organic encapsulation layer 420, or between the organic encapsulation layer 420 and the second inorganic encapsulation layer 430. In this manner, the formation of a penetration path of external moisture or oxygen into the display area DA may be prevented or minimized. A polarizing plate may be on the thin-film encapsulation layer 400 (e.g., may be adhered through a substantially transparent adhesive). The polarizing plate may reduce external light reflection. Instead of the polarizing plate, a layer including a black matrix and a color filter may be used.

In an exemplary embodiment of the present invention, a dam portion 120 may be arranged in the peripheral area PA. The dam portion 120 may be arranged spaced apart from the second planarization layer 111 and the pixel defining layer 113. When the organic encapsulation layer 420 of the thin-film encapsulation layer 400 is formed, it is possible to prevent organic materials from flowing to the edge of the substrate 100. When a plurality of dam portions 120 are provided, a plurality of dams may be arranged spaced apart from each other.

The dam portion 120 may be formed as a single layer or multiple layers. As an example, the dam portion 120 may have a structure in which a first layer 120a, a second layer 120b, and a third layer 120c are stacked. In this case, the first layer 120a may include a same material as that of the first planarization layer 109. The first layer 120a may be formed at substantially the same time as the first planarization layer 109. The second layer 120b may include a same material as that of the second planarization layer 111. The second layer 120b may be formed at substantially the same time as the second planarization layer 111. The third layer 120c may include a same material as that of the pixel defining layer 113. The third layer 120c may be formed at substantially the same time as the pixel defining layer 113. However, the present invention is not limited thereto. The first dam 121 may be formed as a single layer or a double layer and various modifications may be made.

Since the first inorganic encapsulation layer 410 and the second inorganic encapsulation layer 430 of the thin-film encapsulation layer 400 are directly brought into contact with the outside of the dam portion 120, the organic encapsulation layer 420 might not be exposed to the outside. Thus, permeation of outside air or moisture by organic materials may be prevented.

In an exemplary embodiment of the present invention, the conductive layer 311 may include a same material as that of the pixel electrode 310 and may be between the second power supply voltage line 20 and the opposite electrode 330. When the conductive layer 311 is arranged, a portion of the conductive layer 311 may be between the second layer 120b and the third layer 120c of the dam portion 120.

The display device according to an exemplary embodiment of the present invention may reduce the dead space of the peripheral area PA while realizing a relatively high-quality image by arranging the first built-in circuit portion 30 adjacent to the trench portion TH of the substrate 100 and overlapping the first built-in circuit portion 30 and the connecting wiring CL.

Figure 10:
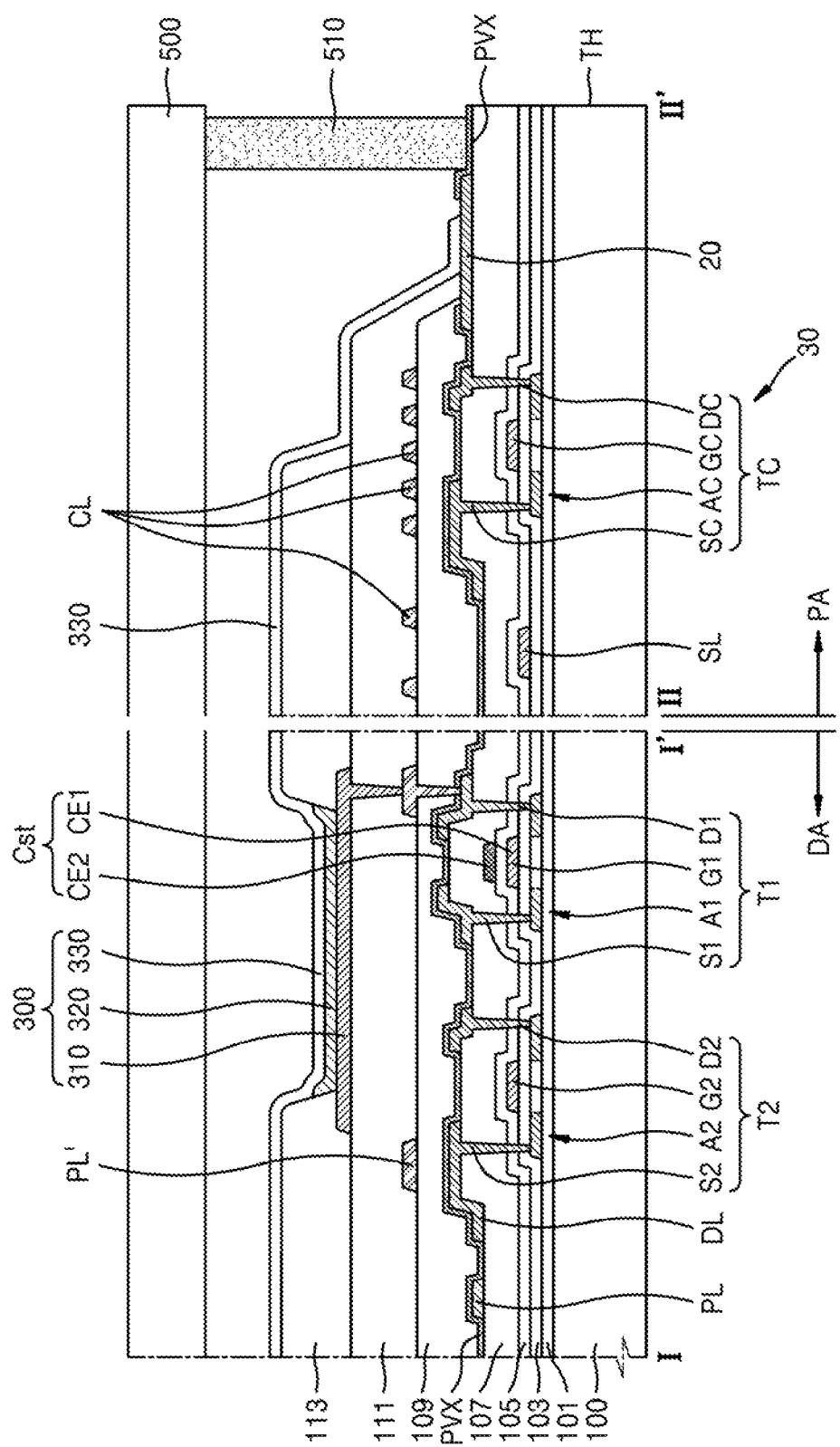
FIG. 10 is a cross-sectional view of a portion of a display device according to an exemplary embodiment of the present invention.

FIG. 10 is a cross-sectional view of a display device according to an exemplary embodiment of the present invention. In FIG. 10, the same reference numerals in FIG. 5 denote the same elements, and duplicate description thereof may be omitted.

Referring to FIG. 10, the TFTs T1 and T2 and the organic light-emitting device OLED as a display element may be arranged in the display area DA of the display device. The first built-in circuit portion 30 and the connecting wiring CL overlapping the first built-in circuit portion 30 may be arranged in the peripheral area PA adjacent to the trench portion TH of the substrate 100.

The first built-in circuit portion 30 may include at least one peripheral TFT TC, and the connecting wiring CL at least partially overlapping the peripheral TFT TC (e.g., along the third direction orthogonal to the first and second directions). The connecting wiring CL may be arranged below the peripheral TFT TC of the peripheral area PA to transmit a data signal or a driving voltage.

In an exemplary embodiment of the present invention, the display area DA may be sealed by a sealing substrate 500 and a sealing member 510. The sealing substrate 500 may be arranged to face the substrate 100 to substantially cover the display area DA and may be joined to the substrate 100 with the sealing member 510 in the peripheral area PA.

The sealing substrate may include a glass material. The sealing member 510 may include a frit that is cured by laser light. The sealing member 510 may be arranged continuously surrounding the display area DA.

The sealing substrate 500 and the sealing member 510 may seal the display area DA so that oxygen and/or moisture do not flow into the display area DA. Various functional layers such as a touch screen layer and a polarizing film may be further included over the sealing substrate 500.

The display device according to an exemplary embodiment of the present invention may reduce the dead space of the peripheral area PA while realizing a relatively high-quality image by arranging the first built-in circuit portion 30 adjacent to the trench portion TH of the substrate 100 and overlapping the first built-in circuit portion 30 and the connecting wiring CL (e.g., along the third direction orthogonal to the first and second directions).

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein. For example, the embodiment described with reference FIG. 9 or 10 may be applied to the embodiments described with reference to FIGS. 5 to 8B, and various combinations may be made.

Embodiments of the disclosure may implement a display device capable of reducing a peripheral area while providing a relatively high-quality image by providing a built-in circuit portion adjacent to a trench portion and overlapping the built-in circuit portion and a connecting wiring.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device, comprising:
   a substrate including a trench portion, the substrate comprising a display area and a peripheral area adjacent to the display area, wherein the display area comprises a first display area and a second display area arranged with the trench portion therebetween to display an image;
   a thin-film transistor and a display element, each arranged in the display area;
   a built-in circuit portion over the peripheral area and adjacent to the trench portion;
   a first wiring in the first display area and a second wiring in the second display area; and
   a connecting wiring connecting the first wiring to the second wiring and overlapping the built-in circuit portion,
   wherein the trench portion is a portion recessed from one side of the substrate to the display area in a plan view.

2. The display device of claim 1, wherein the built-in circuit portion comprises a plurality of stages comprising at least one peripheral thin-film transistor, and
   the connecting wiring overlaps the at least one peripheral thin-film transistor.

3. The display device of claim 1, further comprising:
   a scan line connected to the built-in circuit portion and overlapping the display area,
   wherein the scan line intersects the connecting wiring in a layer different from that of the connecting wiring.

4. The display device of claim 1, wherein the connecting wiring comprises a first connecting wiring and a second connecting wiring adjacent to each other, and
   a shortest distance between the first connecting wiring and the second connecting wiring in a region not overlapping the built-in circuit portion is greater than a shortest distance between the first connecting wiring and the second connecting wiring in a region overlapping the built-in circuit portion.

5. The display device of claim 1, wherein the connecting wiring comprises a first connecting wiring and a second connecting wiring adjacent to each other, and the first connecting wiring and the second connecting wiring in a region overlapping the built-in circuit portion are curved.

6. The display device of claim 5, wherein a degree of curvature of the first connecting wiring and a degree of curvature of the second connecting wiring in the region overlapping the built-in circuit portion are different from each other.

7. The display device of claim 1, wherein the substrate comprises a first side on which the trench portion is located and a second side that intersects the first side and is longer than the first side, and
   a pad portion which is adjacent to the second side in the peripheral area and transmits a control signal to the first wiring.

8. The display device of claim 1, further comprising:
   an inorganic protective layer substantially covering the first wiring and the second wiring,
   a planarization layer disposed on the inorganic protective layer,
   wherein the connecting wiring is located over the planarization layer and connected to the first wiring and the second wiring through a first contact hole and a second contact hole penetrating the planarization layer and the inorganic protective layer, respectively.

9. A display device, comprising:
   a substrate including a trench portion, the substrate comprising a display area and a peripheral area adjacent to the display area, wherein the display area comprises a first display area and a second display area arranged with the trench portion therebetween to display an image;
   a thin-film transistor and a display element, each arranged in the display area;
   a built-in circuit portion over the peripheral area and adjacent to the trench portion;
   a first wiring in the first display area and a second wiring in the second display area;
   a connecting wiring connecting the first wiring to the second wiring and overlapping the built-in circuit portion;
   a first power supply voltage line arranged to correspond to one side of the display area; and
   a second power supply voltage line adjacent to at least a portion of the display area,
   wherein the built-in circuit portion is located between the display area and the second power supply voltage line.

10. The display device of claim 9, wherein the second power supply voltage line includes a first layer and a second layer on the first layer, the first layer provided in a same layer as that of the first wiring and the second layer comprising a same material as that of the connecting wiring.

11. The display device of claim 9, wherein the display element comprises a pixel electrode, an intermediate layer, and an opposite electrode,
   a conductive layer is located over the second power supply voltage line, the conductive layer comprising a same material as that of the pixel electrode, and
   the opposite electrode overlapping the peripheral area and electrically connected to the second power supply voltage line via the conductive layer.

12. The display device of claim 1, further comprising:
   a lower conductive layer overlapping the thin-film transistor with an insulating layer therebetween, the lower conductive layer being located between the substrate and the thin-film transistor, wherein the connecting wiring is on a same layer as that of the lower conductive layer.

13. The display device of claim 12, wherein the connecting wiring is connected to the first wiring through a contact hole penetrating the insulating layer.

14. The display device of claim 1, further comprising:
a thin-film encapsulation layer sealing the display area and comprising at least one inorganic encapsulation layer and at least one organic encapsulation layer; and
a dam portion in the peripheral area and protruding from the substrate.

15. The display device of claim 1, further comprising:
a sealing substrate sealing the display area and facing the substrate; and
a sealing member adjacent to the peripheral area and joining the substrate to the sealing substrate.

16. A display device, comprising:
a substrate including a trench portion, the substrate comprising a display area and a peripheral area adjacent to the display area, wherein the display area comprises a first display area and a second display area arranged with the trench portion therebetween to display an image;
a thin-film transistor and a display element, each arranged in the display area;
a first built-in circuit portion over the peripheral area and adjacent to the trench portion, the first built-in circuit portion comprising at least one peripheral thin-film transistor;
a pad portion over a second side intersecting the first side, wherein a controller is mounted on the pad portion;
a first wiring in the first display area and a second wiring in the second display area; and
a connecting wiring connecting the first wiring to the second wiring and overlapping the first built-in circuit portion.

17. The display device of claim 16, wherein the second side is longer than the first side.

18. The display device of claim 16, further comprising:
a second built-in circuit portion adjacent to a third side at a side opposite to that of the first side of the substrate.

19. The display device of claim 16, wherein the connecting wiring overlaps the at least one peripheral thin-film transistor.

20. The display device of claim 1, wherein at least a portion of the connecting wiring is curved along a shape of the trench portion.

* * * * *